(12) United States Patent
Oishi et al.

(10) Patent No.: US 12,033,945 B2
(45) Date of Patent: Jul. 9, 2024

(54) MICROELECTRONIC DEVICE INTERFACE CONFIGURATIONS, AND ASSOCIATED METHODS, DEVICES, AND SYSTEMS

(71) Applicant: Micron Technology, Inc., Boise, ID (US)

(72) Inventors: Hayato Oishi, Tokyo (JP); Satoru Sugimoto, Tokyo (JP); Hiroki Hosaka, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 16/832,550

(22) Filed: Mar. 27, 2020

(65) Prior Publication Data

US 2021/0305159 A1   Sep. 30, 2021

(51) Int. Cl.
*H01L 25/00* (2006.01)
*H01L 23/00* (2006.01)
(Continued)

(52) U.S. Cl.
CPC ...... *H01L 23/5286* (2013.01); *H01L 23/5226* (2013.01); *H01L 24/03* (2013.01);
(Continued)

(58) Field of Classification Search
CPC ..... H01L 2924/00; H01L 24/06; H01L 24/49; H01L 23/50; H01L 24/05; H01L 23/5226; H01L 2224/023
See application file for complete search history.

(56) References Cited

U.S. PATENT DOCUMENTS

| 6,211,576 B1* | 4/2001 | Shimizu | H01L 23/50 |
| | | | 257/E23.079 |
| 6,798,069 B1* | 9/2004 | Ali | H01L 24/06 |
| | | | 257/E23.079 |

(Continued)

FOREIGN PATENT DOCUMENTS

| CN | 1098545 A | 2/1995 |
| CN | 1815723 A | 8/2006 |

(Continued)

OTHER PUBLICATIONS

Hamada et al., U.S. Appl. No. 16/366,100 titled Routing for Power Signals Including a Redistribution Layer filed Mar. 27, 2019.

(Continued)

*Primary Examiner* — Anthony Ho
*Assistant Examiner* — David J Goodwin
(74) *Attorney, Agent, or Firm* — TraskBritt

(57) ABSTRACT

Memory devices are disclosed. A memory device may include a first row of power supply pads and a first row of input/output (DQ) pads. The memory device may further include a row of vias, wherein the first row of DQ pads is positioned at least partially between the row of vias and the first row of power supply pads. The memory device may also include a number of conductors, wherein each via of the row of vias is coupled, via an associated conductor of the number of conductors, to either a power supply pad of the first row of power supply pads or a DQ pad of the first row of DQ pads. Methods of forming an interface region of a memory device, and electronic systems are also disclosed.

19 Claims, 13 Drawing Sheets

(51) Int. Cl.
*H01L 23/50* (2006.01)
*H01L 23/522* (2006.01)
*H01L 23/528* (2006.01)

(52) U.S. Cl.
CPC .... *H01L 24/05* (2013.01); *H01L 2224/02371* (2013.01); *H01L 2224/02372* (2013.01); *H01L 2924/1434* (2013.01)

(56) References Cited

U.S. PATENT DOCUMENTS

| | | | | |
|---|---|---|---|---|
| 7,391,113 | B2* | 6/2008 | Isa | H01L 23/50 |
| | | | | 257/E23.079 |
| 7,872,283 | B2* | 1/2011 | Matsuoka | H01L 23/5286 |
| | | | | 257/691 |
| 8,144,524 | B2* | 3/2012 | Mizukane | G11C 7/1051 |
| | | | | 365/189.05 |
| 8,238,133 | B2* | 8/2012 | Tajima | H01L 24/06 |
| | | | | 365/51 |
| 9,577,640 | B1* | 2/2017 | Park | H03K 19/1732 |
| 10,020,252 | B2* | 7/2018 | Miura | G11C 5/063 |
| 10,141,932 | B1* | 11/2018 | Sato | H03K 19/0013 |
| 2007/0085214 | A1* | 4/2007 | Isa | H01L 23/49838 |
| | | | | 257/E23.079 |
| 2014/0246702 | A1* | 9/2014 | Parks | H03K 19/1732 |
| | | | | 257/E27.11 |
| 2015/0115454 | A1* | 4/2015 | Magnus | H01L 24/19 |
| | | | | 257/773 |
| 2019/0057726 | A1 | 2/2019 | Nishizaki | |
| 2021/0243896 | A1* | 8/2021 | Schmidt | H05K 3/423 |

FOREIGN PATENT DOCUMENTS

| | | |
|---|---|---|
| CN | 101620877 A | 1/2010 |
| CN | 102598255 A | 7/2012 |
| JP | 2006-339252 A | 12/2006 |
| KR | 10-2004-0107244 A | 12/2004 |

OTHER PUBLICATIONS

Oishi et al., U.S. Appl. No. 16/365,218 titled Centralized Placement of Command and Address Swapping in Memory Devices filed Mar. 26, 2019.

Chinese First Office Action for Chinese Application No. 202110281884.2, dated Jan. 10, 2024, 10 pages with translation.

* cited by examiner

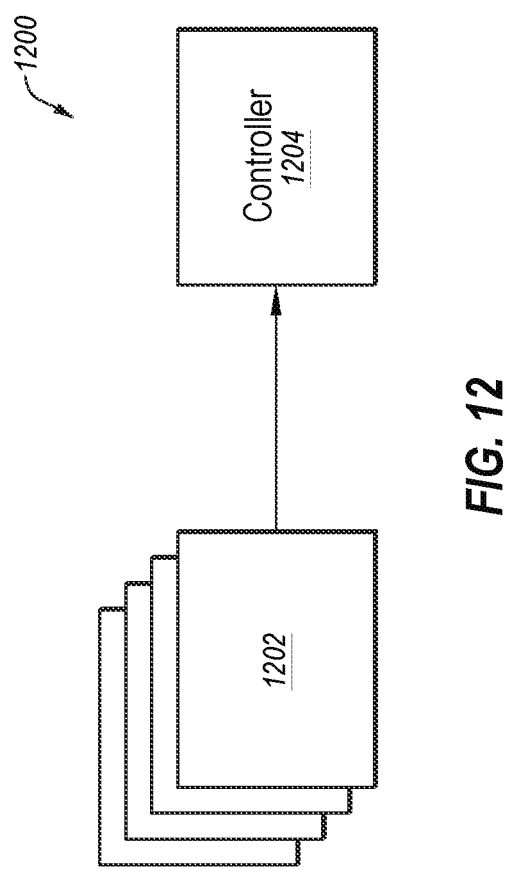

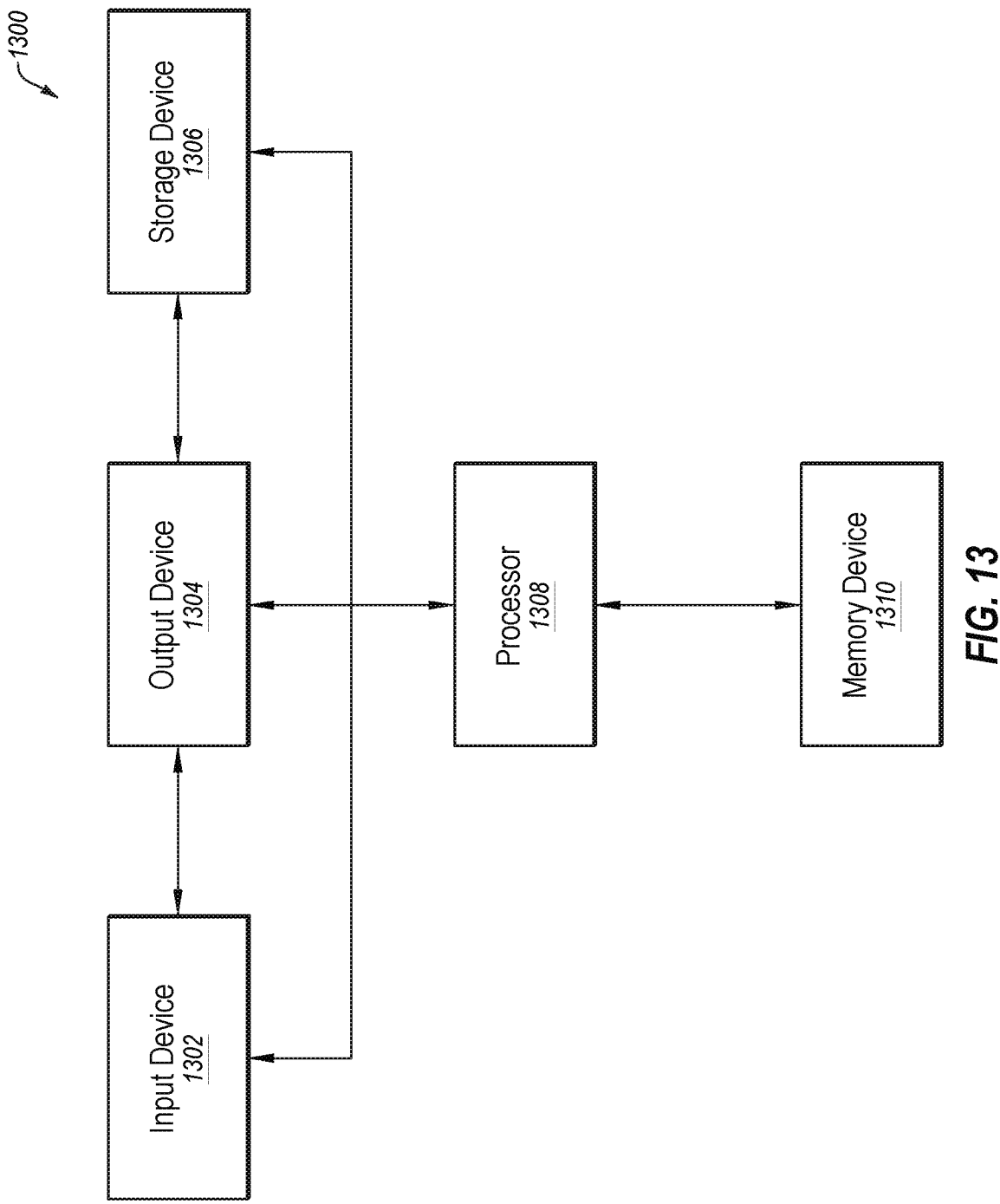

MICROELECTRONIC DEVICE INTERFACE CONFIGURATIONS, AND ASSOCIATED METHODS, DEVICES, AND SYSTEMS

TECHNICAL FIELD

Embodiments of the disclosure relate to microelectronic devices. More specifically, various embodiments relate to microelectronic device interface configurations, and to related methods, devices, and systems.

BACKGROUND

Microelectronic devices, such as semiconductor devices, may include many circuits interconnected with multiple layers of conductor wires. Each conductor layer of a semiconductor device is insulated from other conductor layers with some form of insulating or dielectric material. Even with many wiring layers available, routing of clock signals, data signals, and power signals is a challenge due to the severe size constraint to make semiconductor devices as small as possible. Power consumption is also a design constraint for semiconductor devices. Moreover, power signal routing can be particularly challenging due to the need to keep resistance along a power signal as low as possible.

A semiconductor device may include one or more memory devices provided as internal, semiconductor, integrated circuits in many computers and other electronic systems. Electronic systems, such as memory systems, often include one or more types of memory devices, which is typically coupled to one or more communications channels within a memory system. Time varying signals in such systems are utilized to transfer information (e.g., data) over one or more conductors often referred to as signal lines. These signal lines are often bundled together to form a communications bus, such as an address or data bus.

Memory systems often operate in portable devices with limited power supplied by batteries or other energy storage devices. In these low-power systems, and in general for most memory systems, there is a persistent demand for higher operating performance at lower power. As a result, designers continue to strive for increasing operating speeds and ways to reduce power consumption of memory devices and memory systems.

BRIEF DESCRIPTION OF THE DRAWINGS

FIG. 12 is a simplified block diagram of a memory system, in accordance with various embodiments of the present disclosure.

FIG. 13 is a simplified block diagram of an electronic system, in accordance with various embodiments of the present disclosure.

DETAILED DESCRIPTION

Figure 1A:
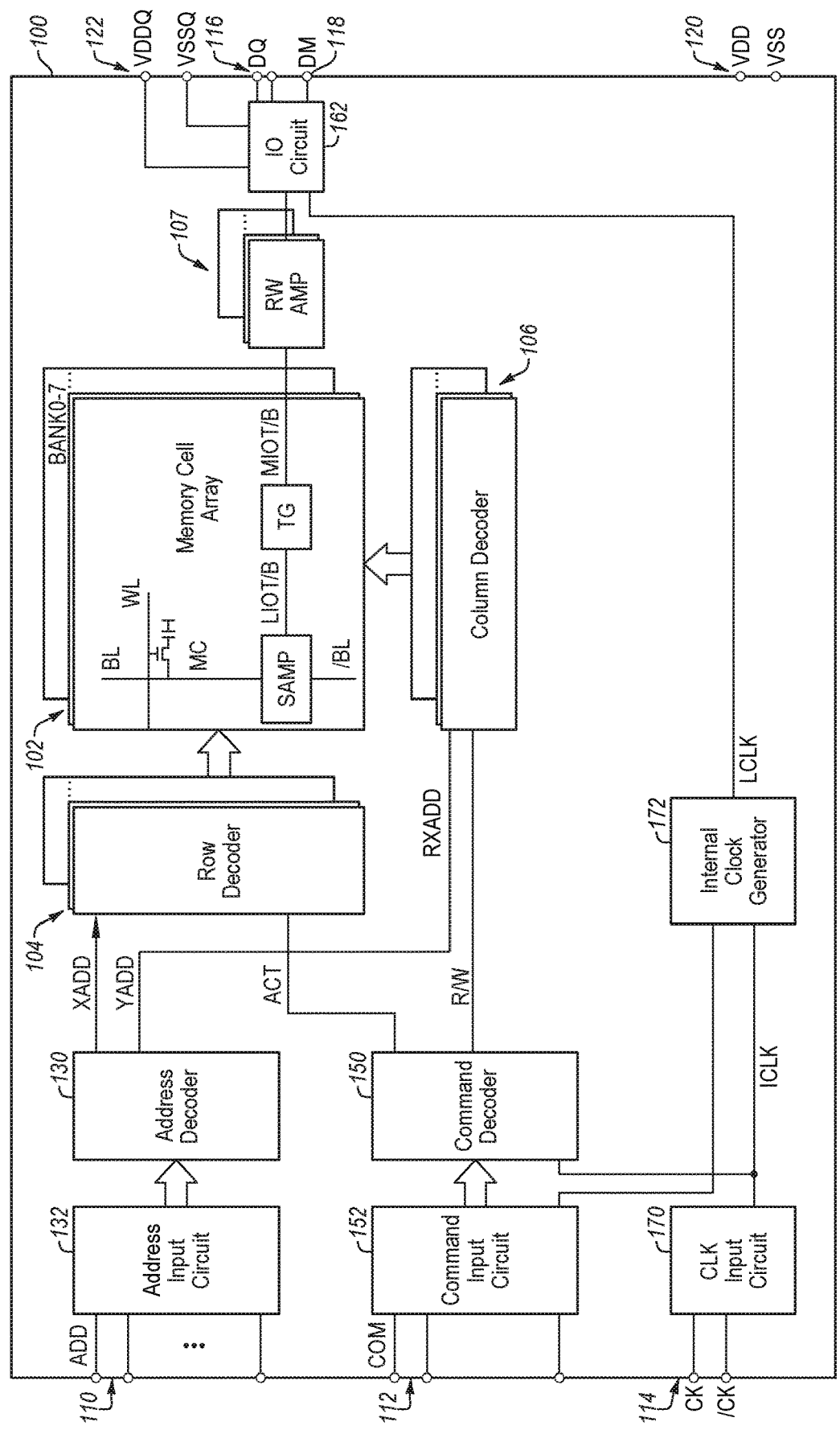
FIG. 1A is a block diagram of an example memory device, in accordance with at least one embodiment of the present disclosure.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored information in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. A non-volatile memory device (e.g., flash memory) can store data for extended periods of time even in the absence of an external power source. A volatile memory device (e.g., DRAM) may lose its stored state over time unless it is periodically refreshed by an external power source. A binary memory device may, for example, include a charged or discharged capacitor.

Memory devices typically include power supply lines throughout the device that provide power from a power supply to transistors and other components that are included in the memory. The power supply lines are typically arranged in different metal layers associated with the device. The resistivity of these power supply lines can dissipate power and generate heat as power is transmitted from the power supply. The farther power travels along the power supply lines, the greater this power dissipation and heat generation can be. Additionally, some metal layers have greater resistivity than others. In some cases, lower metal layers have higher resistivity than upper metal layers. Thus, power that is transmitted on power supply lines located in lower metal layers may be more susceptible to dissipation than power that is transmitted on power supply lines that located in upper metal layers.

To reduce power dissipation and heating issues, some memory devices include a redistribution layer that includes low resistivity lines that provide power to certain locations within the device. This layer may be referred to as an "iRDL layer" and may be formed in a semiconductor process that occurs before an assembly process. For example, an iRDL layer may be an uppermost layer of the device, which may be the lowest resistivity layer in the device. In some cases, an iRDL layer is a metal 4 layer (M4) over the metal 3 layer (M3).

For power to be transferred from the iRDL layer to lower layers of a memory device, the memory device may include one or more "iRDL vias" that provide conductive pathways between power distribution lines in the iRDL layer ("iRDL lines") to wiring that is located in an underlying metal layer. In one example, an iRDL via provides a conductive pathway between a metal 4 layer and a metal 3 layer. The memory device may also include additional vias that provide conductive pathways between other layers, such as M3-M2 vias.

As described more fully below, a semiconductor device (e.g., a memory device) may include one or more interface regions configured in accordance with one or more embodiments of the present disclosure. According to various embodiments, an interface region may include a number of rows (or a number columns) of bond pads. More specifically, according to some embodiments, an interface region may include one or more rows of power supply pads (e.g., for coupling to a power supply terminal) and one or more rows of input/output (DQ) pads (also referred to herein as "data pads") (e.g., for coupling to a data terminal). Further, the interface region may include a number of vias (e.g., iRDL vias) and number of conductors (e.g., iRDL wires), wherein each conductor couples a pad (e.g., either a power supply pad or a DQ pad) to a dedicated via of the number of vias.

As described more fully below, in some embodiments, at least one row of the one or more rows of power supply pads may be positioned closer to an input power source (e.g., a power supply terminal) than at least one row of the one or more rows of DQ pads. More specifically, in at least some embodiments, at least one row of the one or more rows of power supply pads may be positioned at least partially between an input power source and at least one row of the one or more rows of DQ pads. Further, as described more fully below, in some embodiments, at least one row of the one or more rows of DQ pads may be positioned closer to a data input/output (I/O) circuit than at least one row of the one or more rows of power supply pads. More specifically, in at least some embodiments, at least one row of the one or more rows of DQ pads may be positioned at least partially between a data I/O circuit and at least one row of the one or more rows of power supply pads. In these and other embodiments, each power supply pad and each DQ may be coupled to a dedicated via of a row of vias by a conductor (e.g., an iRDL wire).

According to various embodiments, a length of the conductors that couple DQ pads to respective vias may be reduced compared to conventional devices. Moreover, according to some embodiments, a length of each conductor that couples DQ pads to respective vias may be substantially the same. Also, in accordance with at least some embodiments, each DQ pad of a row of DQ pads may be separated from an adjacent DQ pad of the row via a conductor (e.g., an iRDL wire) that couples a power supply pad to its respective via.

Although various embodiments are described herein with reference to memory devices, the present disclosure is not so limited, and the embodiments may be generally applicable to microelectronic devices that may or may not include semiconductor devices and/or memory devices. Embodiments of the present disclosure will now be explained with reference to the accompanying drawings.

FIG. 1A includes a block diagram of an example memory device 100, according to various embodiments of the present disclosure. Memory device 100, which is and may be referred to herein as a memory device, may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include a memory cell array 102.

In the embodiment of FIG. 1A, memory cell array 102 is shown as including eight memory banks BANK0-7. More or fewer banks may be included in memory cell array 102 of other embodiments. Each memory bank includes a number of access lines (word lines WL), a number of data lines (bit lines BL) and /BL, and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1A, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 107 over complementary local data lines (LIOT/B), transfer gate (TG), and complementary main data lines (MIOT/B). Conversely, write data outputted from read/write amplifiers 107 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 107, an input/output circuit 162, and data terminal 116. Further, in response to active command ACT, a write signal, a row address XADD, and a column address YADD, write data may be supplied to memory cell array 102 via data terminal 116, input/output circuit 162, read/write amplifier 107, transfer gate TG, and sense amplifier SAMP. The write data may be written to memory cell MC specified by row address XADD and column address YADD.

Clock signals CK and /CK may be received via clock terminals 114. A clock input circuit 170 may generate internal clock signals ICLK based on clock signals CK and ICK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwriting of corresponding data may be prohibited.

Figure 1B:
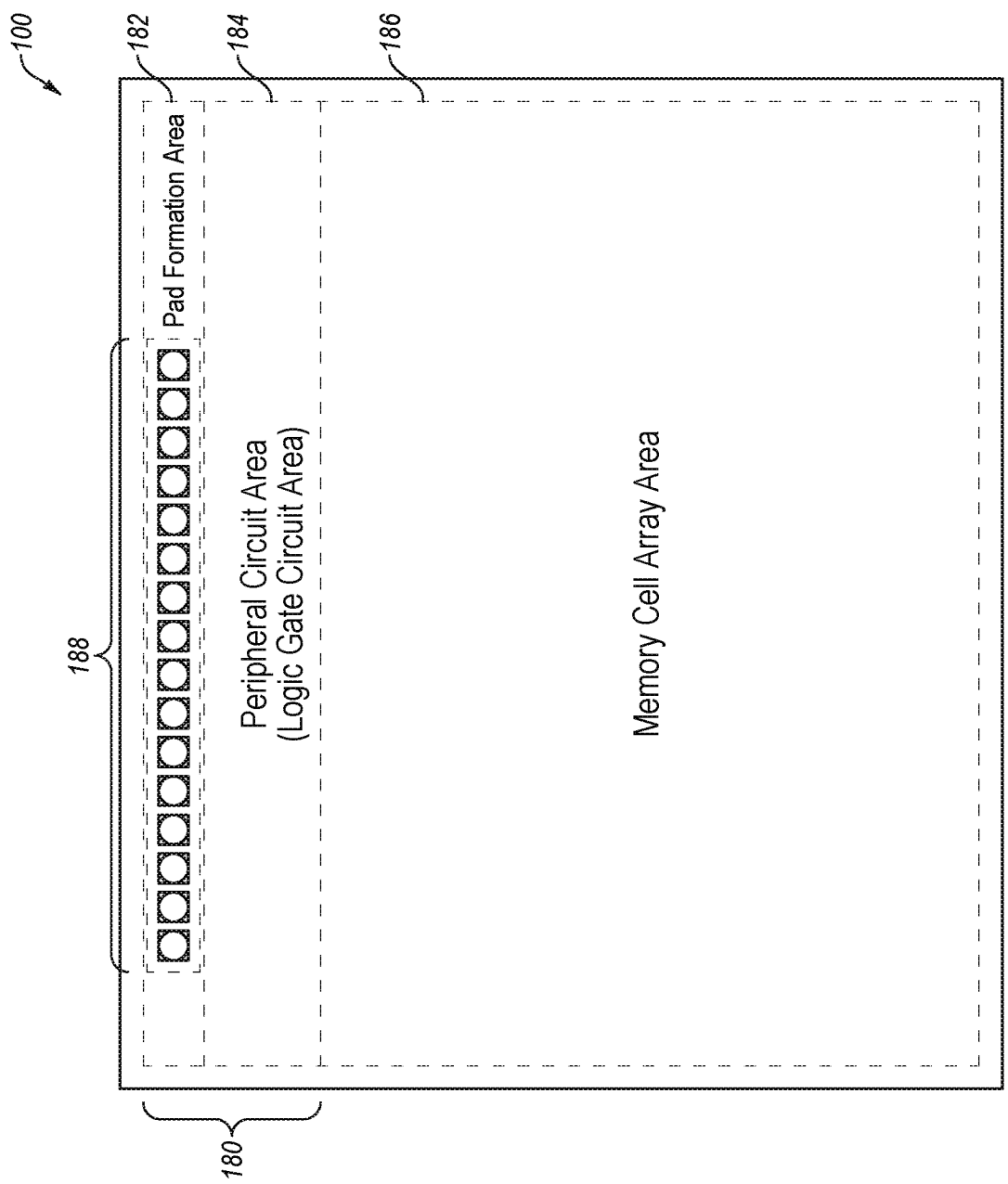
FIG. 1B is a layout diagram of an example memory device, according to one or more embodiments of the present disclosure.

FIG. 1B is a layout diagram of memory device 100, in accordance with various embodiments of the present disclosure. Certain components that are illustrated in FIG. 1A are omitted from FIG. 1B to simply the drawing.

Memory device 100 may include an interface region 180 that includes a pad formation area 182 and a peripheral circuit area 184. Memory device 100 further includes a memory cell array area 186 having a number of memory cells. According to some embodiments, pad formation area 182, peripheral circuit area 184, and memory cell array area 186 may be aligned, and peripheral circuit area 184 may be disposed between pad formation area 182 and memory cell array area 186. Pad formation area 182 may include a number of bond pads 188. For example, bond pads 188 may include, or may be coupled to, terminals 116, 118, 120, and/or 122 shown in FIG. 1A. Further, bond pads 188 may include power supply pads and/or DQ pads, as described more fully below. Memory cell array area 186 may include, for example, memory cell array 102 in FIG. 1A.

Although not specifically shown in FIG. 1B, memory cell array area 186 may also be associated with a second peripheral circuit area that includes another pad area (e.g., arranged along another edge of memory device 100). For example, the second peripheral circuit area may be arranged on an opposite side from peripheral circuit area 184. It should be appreciated that memory devices having pad areas located at devices edges are shown and described herein by way of example and not limitation. Implementations consistent with the present disclosure may use alternative configurations. For example, in some implementations, a pad area may be provided at or near a center or midline of a memory device.

Interface region 180, which may also be referred to herein as a "data interface region," may include one or more power generator blocks (i.e., including a number of power supply pads), one or more data blocks (i.e., including a number of DQ pads), one or more column address blocks, and/or other components that are not specifically shown in FIG. 1B. A data block may include an input receiver that receives an address input via an address pin and an address latch circuit that latches the address. A data block may also include an output buffer that outputs read data to a data I/O pin and/or an input receiver that receives write data supplied via the data I/O pin. A column address block may include a column address decoder that selects bit lines extending through memory cell array area 186 corresponding to respective column addresses. A column address decoder of a column address block may correspond to column decoder 106 of FIG. 1A. A power generator block may include a power source that supplies power to various circuit and components associated with memory device 100. A power generator block may be provided along with one or more transmission lines or other power distribution lines that supply power from the power distribution block to the various components of memory device 100.

As will be appreciated by a person having ordinary skill in the art, iRDL layers have been used in memory for mobile devices. Further, due to the desirable data input and data output speeds and low power consumption, iRDL layers have been used in memory for computing and/or graphics. In these and other examples, a pitch of bond pads of a memory device is relatively large compared to a pitch of iRDL vias that are coupled to an I/O circuit of the memory device.

Figure 2:
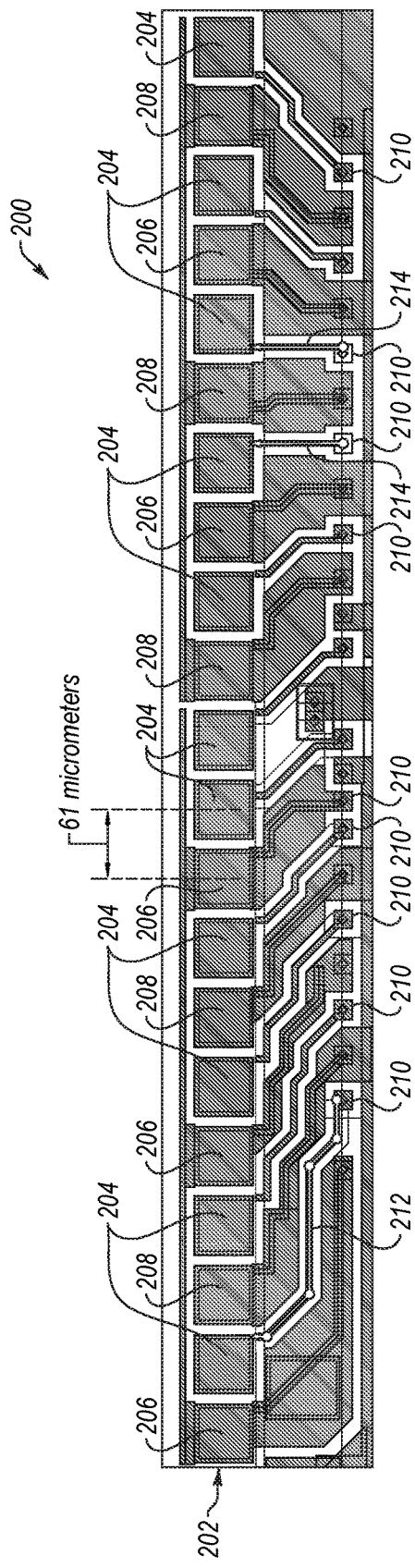
FIGS. 2-5 depict interface regions of example memory devices.

FIG. 2 depicts an interface region 200 of a conventional memory device (i.e., a mobile DRAM device). Interface region 200 includes a bond pad area 202 including a number of bond pads. More specifically, bond pad area 202 includes a number of DQ pads 204, a number of power supply (i.e., VSS) pads 206, and a number of power supply (i.e., VDDQ) pads 208. Further, interface region 200 includes a number of iRDL vias 210, which may be part of, or may be coupled to, an input/output circuit (e.g., input/output circuit 162 of FIG. 1A). Each bond pad is coupled to a dedicated iRDL via 210 by a conductor, such as an iRDL wire.

In the example of FIG. 2, a pitch of the bond pads of bond pad area 202 is 61 micrometers, and a pitch of iRDL vias 210 is 39.7 micrometers. Further, a longest DQ path length (i.e., from a DQ pad to a dedicated via) of interface region 200, which is indicated by reference numeral 212, is 235 micrometers, and a shortest DQ path length (i.e., from a DQ pad to a dedicated via), which is indicated by reference numeral 214, is 78.5 micrometers. Thus, a maximum path length difference of interface region 200 is 156.5 micrometers (i.e., 235 micrometers−78.5 micrometers=156.5 micrometers).

Figure 3:
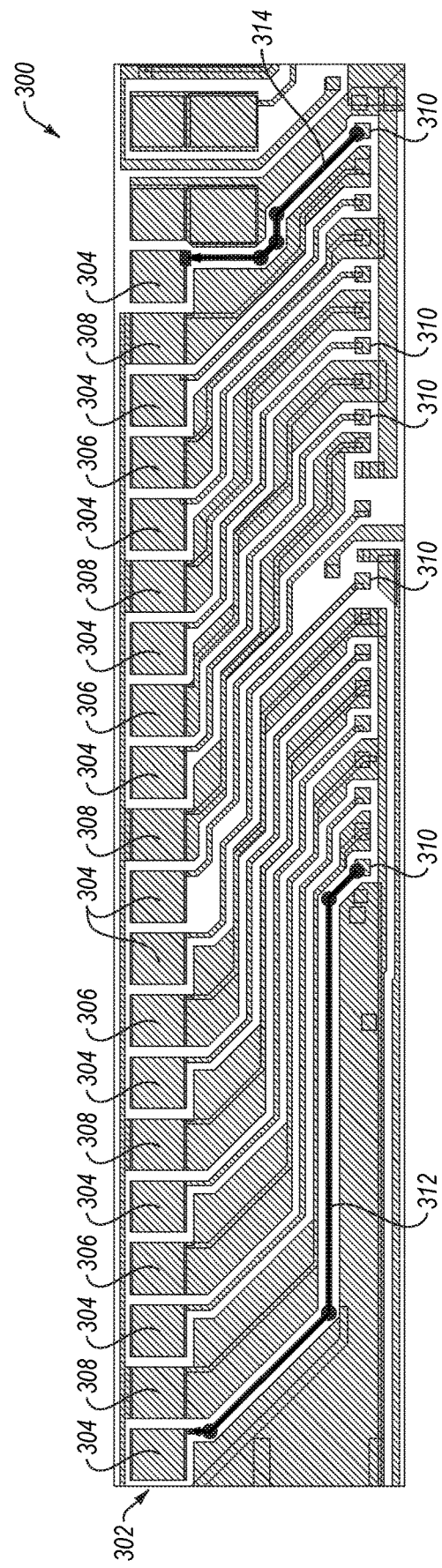

FIG. 3 depicts another interface region 300 of a conventional memory device. Interface region 300 includes a bond pad area 302 including a number of bond pads. More specifically, bond pad area 302 includes a number DQ pads 304, a number of power supply (i.e., VSS) pads 306, and a number of power supply (i.e., VDDQ) pads 308. Further, interface region 300 includes a number of iRDL vias 310. Each bond pad of a bond pad area 302 is coupled to a dedicated iRDL via 310 via a conductor, such as an iRDL wire.

In the example of FIG. 3, a pitch of the bond pads of a bond pad area 302 is 61 micrometers, and a pitch of iRDL vias 310 is between 35.1 and 35.21 micrometers. Further, a longest DQ path length (i.e., from a DQ pad to a dedicated via) of interface region 300, which is indicated by reference numeral 312, is 635 micrometers, and a shortest DQ path length (i.e., from a DQ pad to a dedicated via), which is indicated by reference numeral 314, is 235 micrometers. Thus, a maximum path length difference of interface region 300 is 400 micrometers (i.e., 635 micrometers−235 micrometers=400 micrometers).

Figure 4:
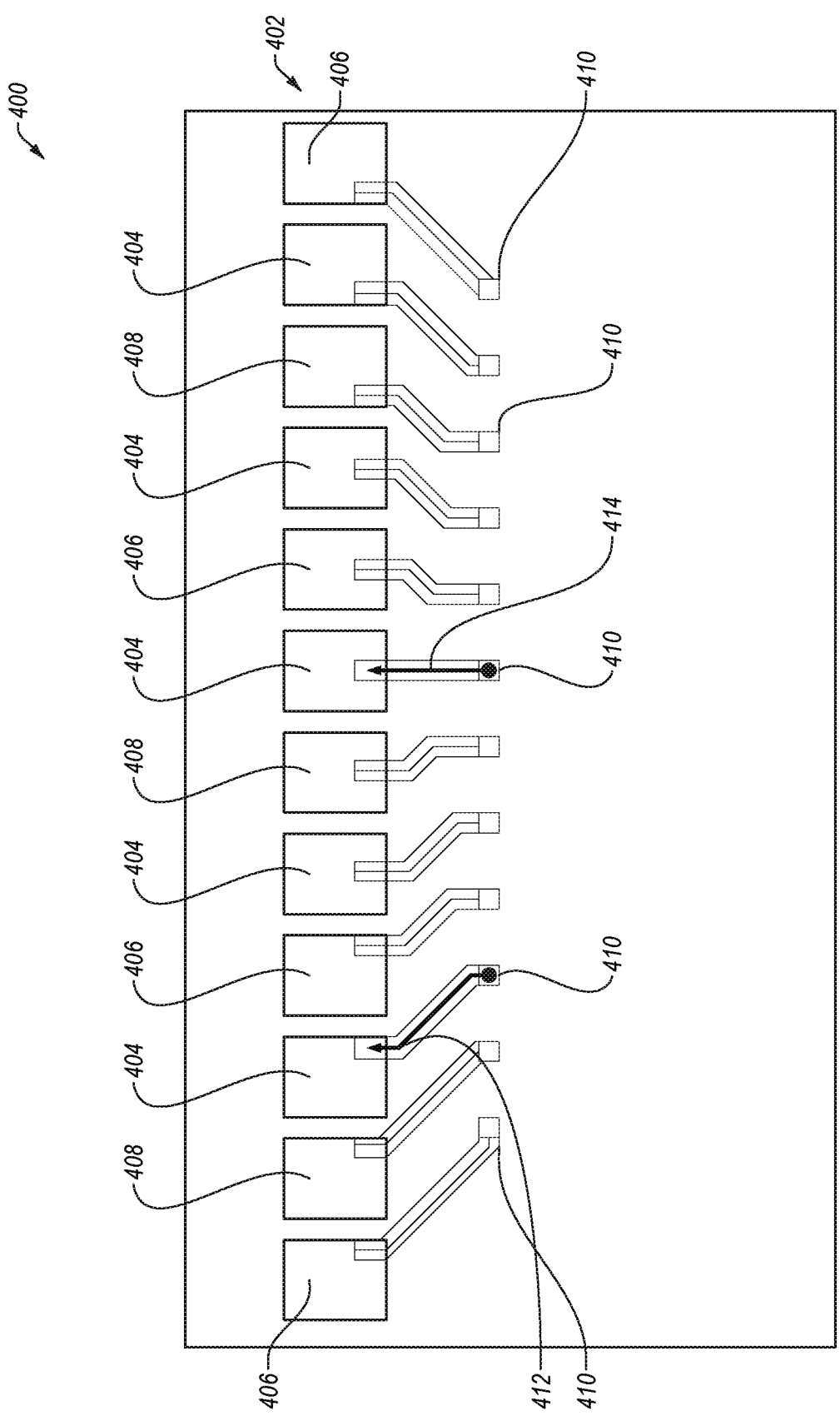

FIG. 4 depicts another interface region 400 of a conventional memory device. Interface region 400 includes a bond pad area 402 including a number DQ pads 404, a number of power supply (i.e., VSS) pads 406, and a number of power supply (i.e., VDDQ) pads 408. Further, interface region 400 includes a number of iRDL vias 410. Each bond pad of interface region 400 is coupled to a dedicated iRDL via 410 by a conductor, such as an iRDL wire.

In this example, a pitch of the bond pads of bond pad area 402 is 80 micrometers, and a pitch of iRDL vias 410 is 60 micrometers. Further, a longest DQ path length (i.e., from a DQ pad to a dedicated via) of interface region 400, which is indicated by reference numeral 412, is 93.3 micrometers, and a shortest DQ path length (i.e., from a DQ pad to a dedicated via), which is indicated by reference numeral 414, is 70 micrometers. Thus, a maximum path length difference of interface region 400 is 23.3 micrometers (i.e., 93.3 micrometers–70 micrometers=23.3 micrometers).

Figure 5:
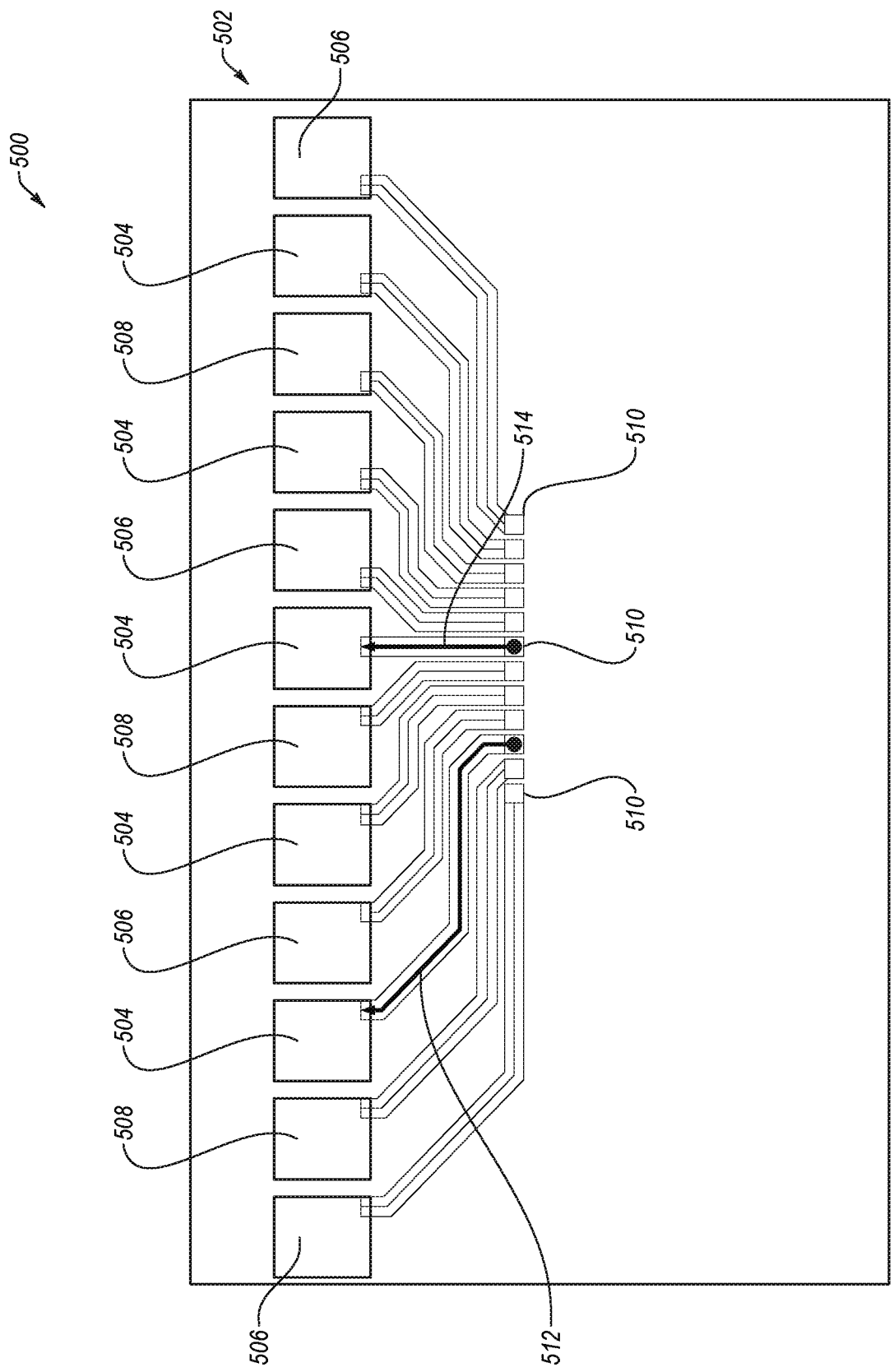

FIG. 5 depicts another interface region 500 of a conventional memory device. Interface region 500 includes a bond pad area 502 including a number DQ pads 504, a number of VSS pads 506, and a number of VDDQ pads 508. Further, interface region 500 includes a number of iRDL vias 510. Each bond pad of interface region 500 is coupled to a dedicated iRDL via 510 by a conductor, such as an iRDL wire.

In this example, a pitch of the bond pads of bond pad area 502 is 80 micrometers, and a pitch of iRDL vias 510 is 20 micrometers. Further, a longest DQ path length (i.e., from a DQ pad to a dedicated via) of interface region 500, which is indicated by reference numeral 512, is 330 micrometers, and a shortest DQ path length, which is indicated by reference numeral 514, is 114 micrometers. Thus, a maximum path length difference of interface region 500 is 216 micrometers (i.e., 330 micrometers–114 micrometers=216 micrometers).

As will be appreciated by a person having ordinary skill in the art, decreasing the pitch of a DQ circuit unit (i.e., iRDL vias of an input/output circuit) may increase operational speeds and lower current consumption of a memory device. However, because a pitch of the bond pads is not reduced in a similar manner, the difference between the pitch of the bond pads and the pitch of the DQ circuit unit increases (e.g., resulting in a radial "fan" shape configuration as shown in FIGS. 2-5). Therefore, the path length of the wiring (i.e., iRDL wiring between a bond pad and an iRDL via) increases (e.g., thus increasing power consumption and/or decreasing operational speeds), and the difference between the shortest path length and the longest path length also increases (e.g., thus decreasing signal quality and introducing timing issues).

In accordance with various embodiments disclosed herein, a memory device, and more specifically, an interface region of the memory device, may include multiple rows of bond pads including a first row of bond pads (e.g., power supply pads) and a second row of bond pads (e.g., DQ pads), wherein the second row of bond pads is positioned closer to an I/O circuit than the first row of bond pads. Further, in some embodiments, conductors (e.g., iRDL wires) associated with the first row of bond pads (e.g., power supply pads) may extend near at least one bond pad (e.g., DQ pad) of the second row of bond pads. More specifically, in at least some embodiments, a conductor (e.g., an iRDL wire) associated with the first row of bond pads (e.g., power supply pads) may be proximate to and/or extend between adjacent bond pads (e.g., adjacent DQ pads) of the second row of bond pads. In these embodiments, at least some of the conductors (e.g., iRDL wiring) associated with the power supply pads may function as a shield between at least two DQ pads (e.g., to reduce noise between the two DQ pads).

As will be described more fully below, according to some embodiments, a length of a conductive path (e.g., an iRDL path) associated with each DQ pad (i.e., a path between a DQ pad and an associated iRDL via) is reduced compared to conventional devices. More specifically, in some embodiments, a length of a conductive path associated with each DQ pad (i.e., a path between a DQ pad and an associated iRDL via) is 10 micrometers or less (e.g., at or near zero (0) micrometers). Further, in at least some embodiments, compared to conventional devices, a maximum path length difference (i.e., difference between the longest path length and the shortest path length) of conductive paths associated with the DQ pads is reduced (e.g., to 10 micrometers or less (e.g., to or near zero (0) micrometers)). By reducing a path length and/or a path length difference, power consumption of an associated semiconductor device may be decreased and/or operation of the semiconductor device may be improved. More specifically, for example, current consumption may be decreased, the speed of operations (e.g., I/O operations) may be increased, and signal quality may be increased.

Figure 6:
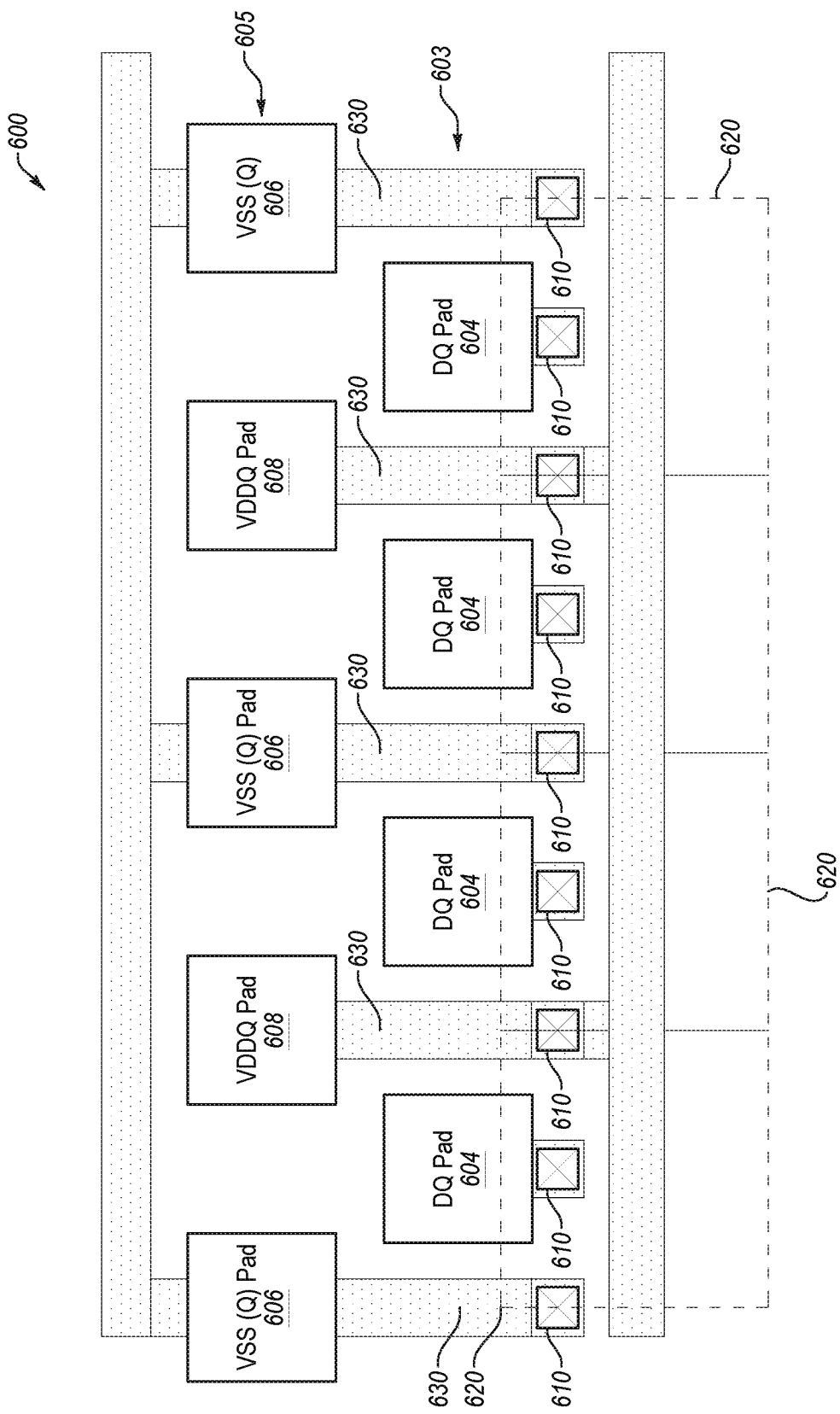
FIG. 6 is a layout diagram depicting an example interface region of a device, in accordance with at least one embodiment of the present disclosure.

FIG. 6 is a layout diagram depicting an example interface region 600 of a device (e.g., a microelectronic device, a semiconductor device, and/or a memory device), in accordance with various embodiments of the present disclosure. As shown, interface region 600 (also referred to herein as an "interface layout," an "interface configuration," or simply a "layout" or a "configuration") includes a row 603 of DQ pads 604 and a row 605 of power supply pads including VSS pads 606 and VDDQ pads 608. Interface region 600 further depicts a number of iRDL vias 610 and an input/output circuit 620. For example, input/output circuit 620 may include input/output circuit 162 of FIG. 1A. According to some embodiments, iRDL vias 610 may be part of, or may be coupled to, input/output circuit 620.

Interface region 600 further includes a number of conductors (also referred to herein as "conductive paths") 630 coupling power supply pads 606/608 to respective vias 610. As illustrated in FIG. 6, row 603 of DQ pads 604 and a row 605 of power supply pad are offset in at least two dimensions (e.g., X and Y dimensions). More specifically, rows 603 and 605 are offset in a first direction (e.g., Y direction), and each pad of row 603 is offset from each pad of row 605 in a second direction (e.g., X direction). Further, according to some embodiments, each DQ pad 604 may be separated from an adjacent DQ pad 604 via conductor 630 coupled between power supply pad 606/608 and via 610. Thus, in these embodiments, each DQ pad 604 may be shielded from adjacent DQ pads (e.g., to reduce noise between DQ pads).

According to some embodiments, DQ pads 604 may be positioned sufficiently close to a dedicated via 610 such that any conductive path (e.g., iRDL wire) that may be needed to couple a DQ pad 604 to a via 610 of interface region 600 may be relatively short (e.g., 10 micrometers or less (e.g., zero (0) micrometers)).

Figure 7:
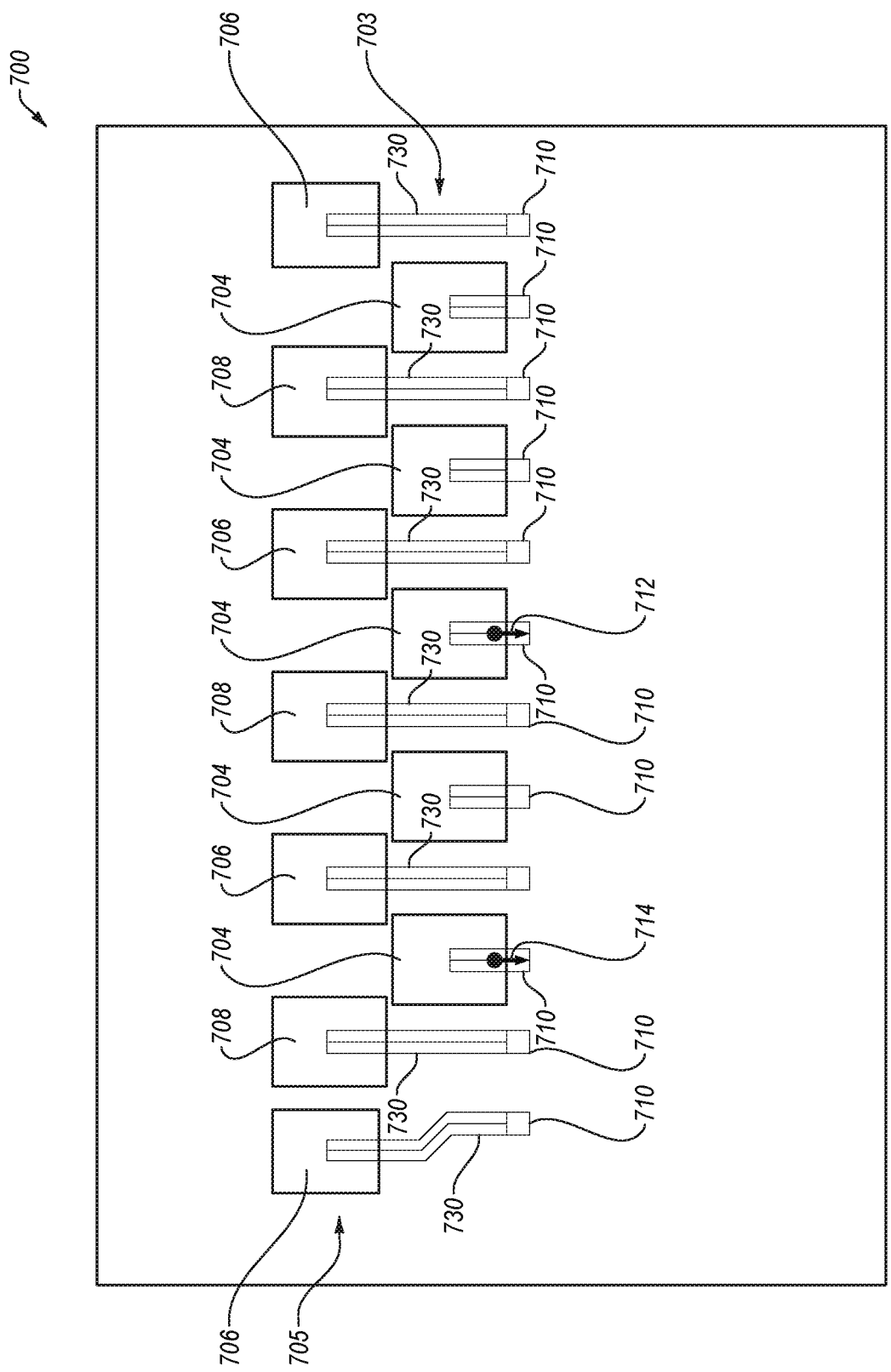
FIG. 7 depicts another example interface region of a device, in accordance with at least one embodiment of the present disclosure.

FIG. 7 depicts an example interface region 700 of a device (e.g., a microelectronic device, a semiconductor device, and/or a memory device), according to various embodiments of the present disclosure. For example, interface region 700 may include interface region 600 of FIG. 6. Like interface region 600, interface region 700 (also referred to herein as an "interface layout," an "interface configuration," or simply a "layout" or a "configuration") includes a row 703 of DQ pads 704 and a row 705 of power supply pads including VSS pads 706 and VDDQ pads 708. Interface region 700 further depicts a number of iRDL vias 710 (e.g., in a row). According to some embodiments, iRDL vias 710 may be part of, or may be coupled to, an input/output circuit (not shown in FIG. 7) of the device, such as input/output circuit 162 of FIG. 1A.

Interface region 700 further includes a number of conductors (also referred to herein as "conductive paths") 730 coupling power supply pads 706/708 to respective vias 710. As illustrated in FIG. 7, row 703 of DQ pads 704 and row 705 of power supply pads 706/708 are offset in at least two dimensions (e.g., X and Y dimensions), and each DQ pad 704 may be separated from an adjacent DQ pad 704 via conductor 730 coupled between a power supply pad 706/708 and via 710. Thus, in these embodiments, each DQ pad 704 may be shielded from adjacent DQ pads (e.g., to reduce noise between DQ pads).

According to some embodiments, DQ pads 704 may be positioned sufficiently close to a dedicated via 710 such that any conductive path (e.g., iRDL wire) that may be needed to couple a DQ pad 704 to a via 710 of interface region 700 may be relatively short (e.g., 10 micrometers or less (e.g., substantially zero (0) micrometers)).

According to some embodiments, a pitch of DQ pads 704 may be greater than a pitch of iRDL vias 710. More specifically, for example, a pitch of DQ pads 704 may be twice the amount of a pitch of iRDL vias 710, three times the amount of the pitch of iRDL vias 710, four times the amount of the pitch of iRDL vias 710, or any other suitable relationship. In one non-limiting example, a pitch of DQ pads 704 is approximately 120 micrometers, and the pitch of vias 710 is approximately 60 micrometers. In some embodiments, a pitch of power supply pads 706/708 may be substantially equal to the pitch of DQ pads 704. Further, a longest DQ path length (i.e., from a DQ pad 704 to a via 710), which is indicated by reference numeral 712, is substantially 10 micrometers or less (e.g., zero (0) micrometers), and a shortest DQ path length (i.e., from a DQ pad 704 to a via 710), which is indicated by reference numeral 714, is also substantially 10 micrometers or less (e.g., zero (0) micrometers). Thus, is this example, a maximum path length difference of interface region 700 is substantially 10 micrometers or less (e.g., substantially zero (0) micrometers).

Figure 8:
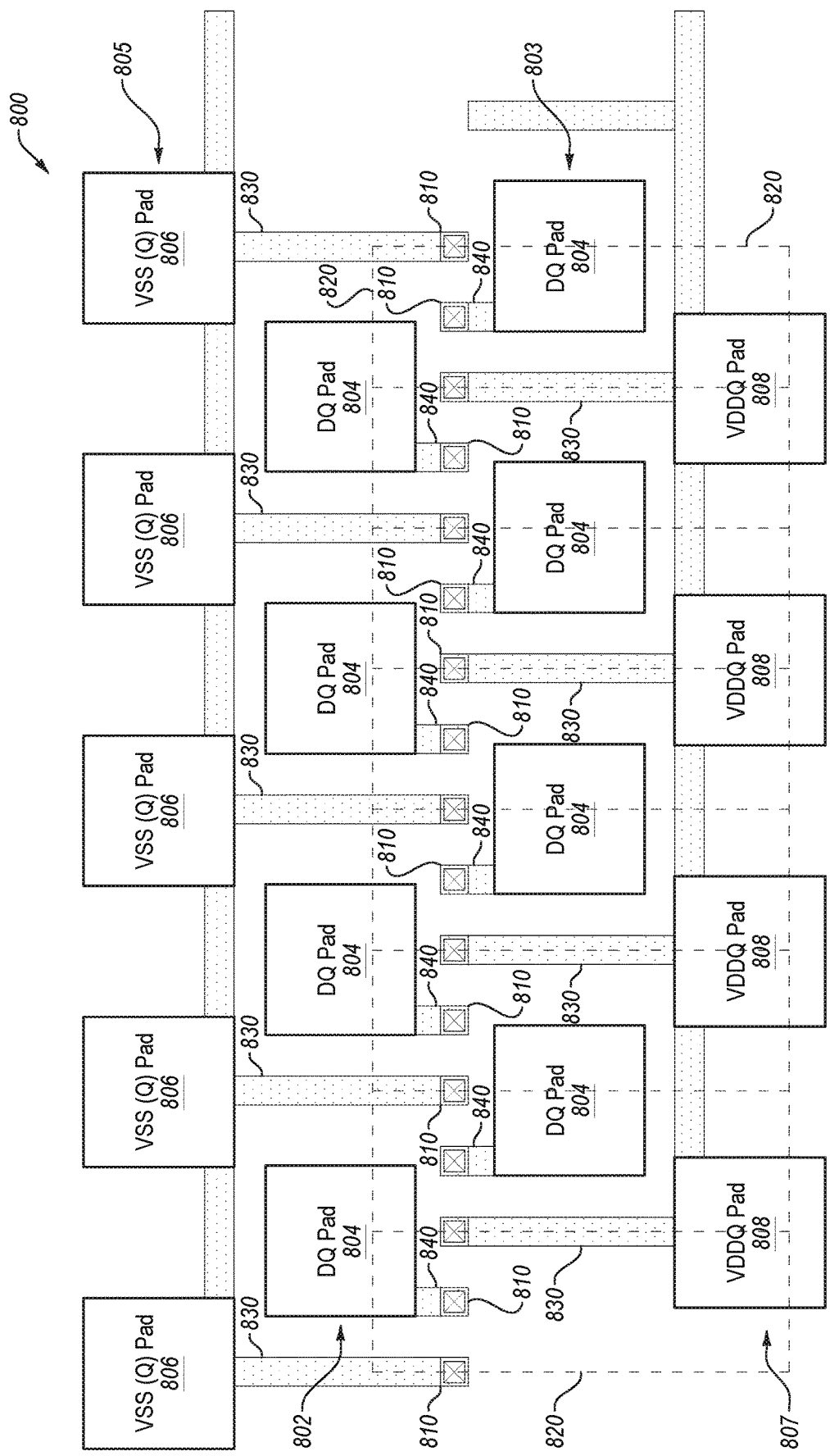
FIG. 8 is a layout diagram depicting another example interface region of a device, in accordance with at least one embodiment of the present disclosure.

FIG. 8 is a layout diagram depicting another example interface region 800 of a device (e.g., a microelectronic device, a semiconductor device, and/or a memory device), in accordance with various embodiments of the present disclosure. In this embodiment, interface region (also referred to herein as an "interface layout," an "interface configuration," or simply a "layout" or a "configuration") 800 includes a number of rows (e.g., two (2) rows) of DQ pads and another number of rows (e.g., two (2) rows) of power supply pads. More specifically, as shown in FIG. 8, interface region 800 includes a row 802 of DQ pads 804 and another row 803 of DQ pads 804. Interface region 800 further includes a row 805 of VSS pads 806 and a row 807 of VDDQ pads 808. Interface region 800 further depicts a number of iRDL vias 810, and an input/output circuit 820. For example, input/output circuit 820 may include input/output circuit 162 of FIG. 1A. According to some embodiments, iRDL vias 810 may be part of, or may be coupled to, input/output circuit 820.

Interface region 800 further includes a number of conductors (also referred to herein as "conductive paths") 830 coupling power supply pads 806/808 to respective vias 810. As illustrated in FIG. 8, row 802 of DQ pads 804 and row 805 of power supply pads 806 are offset in at least two dimensions (e.g., X and Y dimensions). Similarly, row 803 of DQ pads 804 and row 807 of power supply pads 808 are offset in at least two dimensions (e.g., X and Y dimensions). Further, each DQ pad 804 in a row may be separated from an adjacent DQ pad 804 of the row via conductor 830 coupled between a power supply pad 806/808 and via 810. Thus, in these embodiments, each DQ pad 804 of a row may be shielded from adjacent DQ pads of the row (e.g., to reduce noise between DQ pads).

According to some embodiments, DQ pads 804 may be positioned sufficiently close to an associated via 810 such that any conductive path (e.g., iRDL wire) 840 that may be needed to couple a DQ pad of interface region 800 to an associated via may be relatively short (e.g., 10 micrometers or less (e.g., substantially zero (0) micrometers)).

Figure 9:
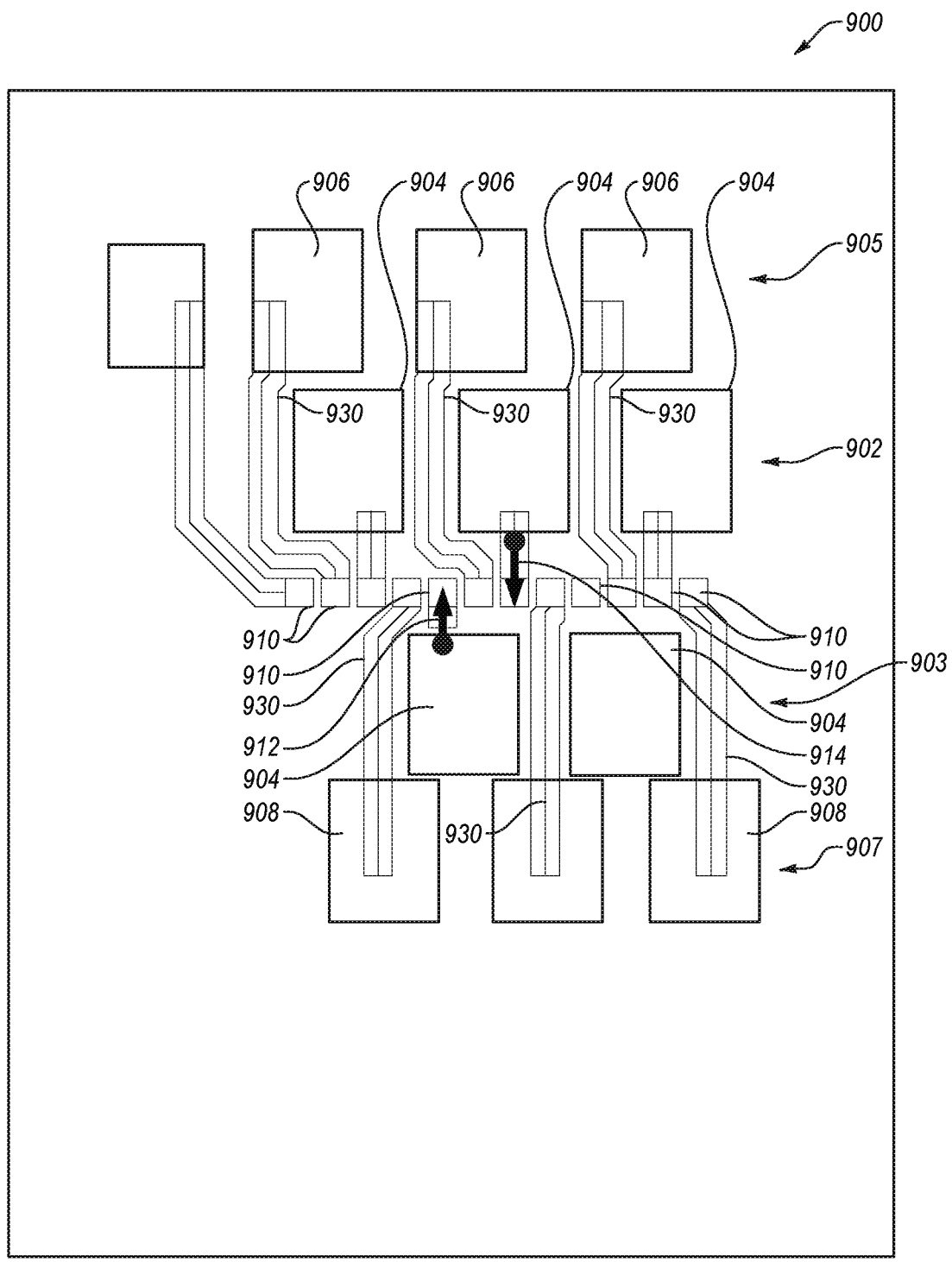
FIG. 9 depicts another example interface region of a device, in accordance with at least one embodiment of the present disclosure.

FIG. 9 depicts another example interface region 900 of a device (e.g., a microelectronic device, a semiconductor device, and/or a memory device), according to various embodiments of the present disclosure. For example, interface region 900 may include interface region 800 of FIG. 8. Like interface region 800, interface region 900 (also referred to herein as an "interface layout," an "interface configuration," or simply a "layout" or a "configuration") includes a row 902 of DQ pads 904 and a row 905 of power supply pads (e.g., VSS pads 906). Further, interface region 900 includes a row 903 of DQ pads 904 and a row 907 of power supply pads (e.g., VDDQ pads 908). Interface region 900 further depicts a number of iRDL vias 910 (e.g., a row of vias). According to some embodiments, iRDL vias 910 may be part of, or may be coupled to, an input/output circuit (not shown in FIG. 9) of the device, such as input/output circuit 162 of FIG. 1A.

Interface region 900 further includes a number of conductors (also referred to herein as "conductive paths") 930 coupling the power supply pads 906/908 to respective vias 910. As illustrated in FIG. 9, row 902 of DQ pads 904 and row 905 of power supply pads 606 are offset in at least two dimensions (e.g., X and Y dimensions). Further, row 903 of DQ pads 904 and row 907 of power supply pads 908 are offset in at least two dimensions (e.g., X and Y dimensions). Further, according to various embodiments, each DQ pad 904 of a row may be separated from an adjacent DQ pad 904 of the row via conductor 930 coupled between a power supply pad 906/908 and via 910. Thus, in these embodiments, each DQ pad 904 of a row may be shielded from adjacent DQ pads of the row (e.g., to reduce noise between DQ pads).

According to some embodiments, DQ pads of interface region 900 may be positioned sufficiently close to an associated via such that any conductive path (e.g., iRDL wire) that may be needed to couple a DQ pad of interface region 900 to an associated via may be relatively short (e.g., 10 micrometers or less (e.g., substantially zero (0) micrometers)).

As a non-limiting example, a pitch of DQ pads 904 of interface region 900 is approximately 89.0 micrometers, and a pitch of vias 910 is approximately 20 micrometers. In some embodiments, a pitch of power supply pads 906/908 may be substantially equal to the pitch of DQ pads 904. Further, for example, a shortest DQ path length (i.e., from a DQ pad 904 to a via 910) of interface region 900, which is indicated by reference numeral 912, is approximately ten (10) micrometers or less (e.g., nearly zero (0) micrometers), and a longest DQ path length (i.e., from a DQ pad 904 to a via 910), which is indicated by reference numeral 914, is approximately ten (10) micrometers or less (e.g., nearly zero (0) micrometers). Thus, is this example, a maximum path length difference of interface region 900 is approximately ten (10) micrometers or less (e.g., nearly zero (0) micrometers).

Figure 10:
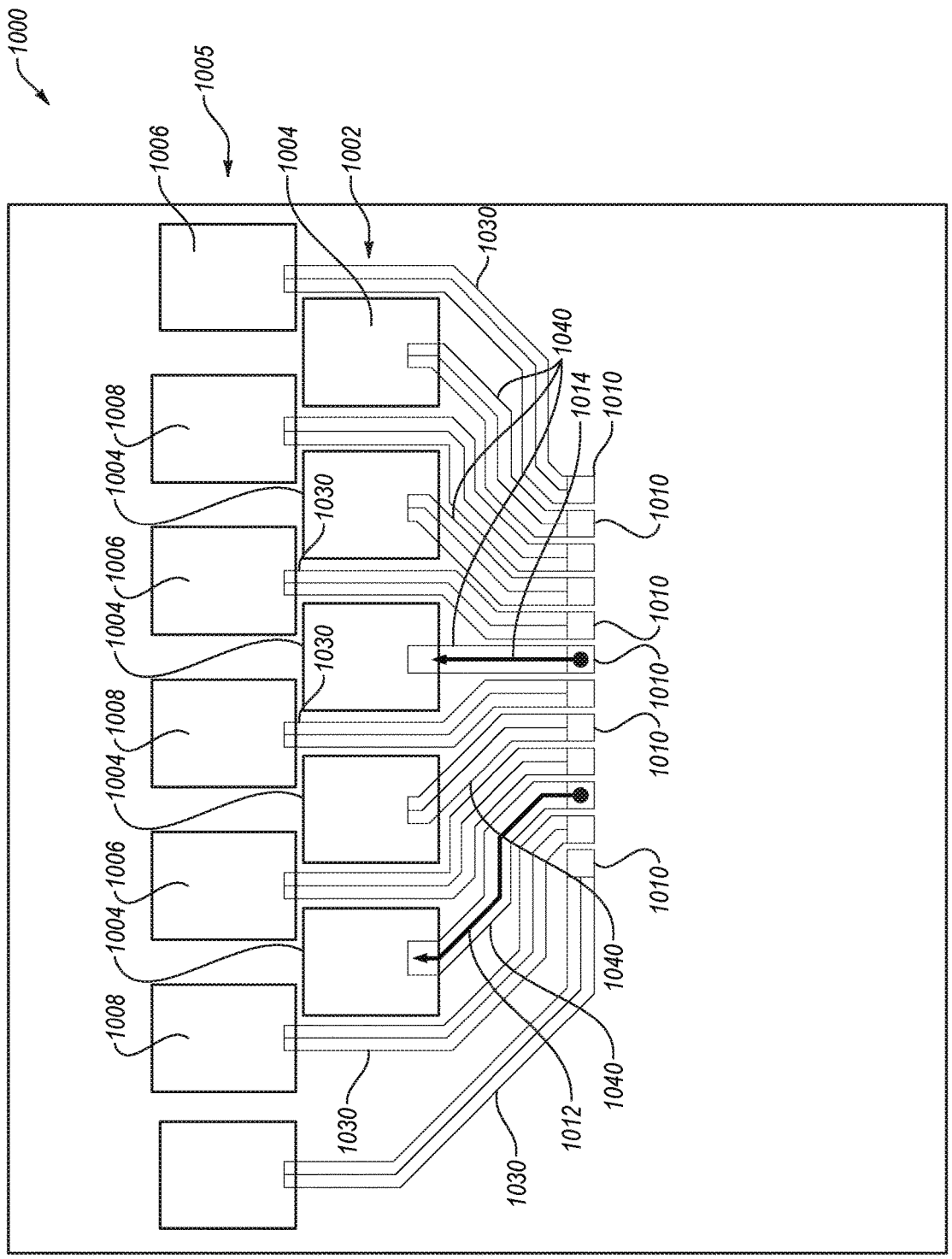
FIG. 10 depicts yet another interface region of a device, in accordance with at least one embodiment of the present disclosure.

FIG. 10 depicts yet another example interface region 1000 of a device (e.g., a microelectronic device, a semiconductor device, and/or a memory device), according to various embodiments of the present disclosure. Interface region 1000 (also referred to herein as an "interface layout," an "interface configuration," or simply a "layout" or a "configuration") includes a row 1002 of DQ pads 1004 and a row 1005 of power supply pads (e.g., VSS pads 1006 and VDDQ pads 1008). Interface region 1000 further depicts a number of iRDL vias 1010. According to some embodiments, iRDL vias 1010 may be part of, or may be coupled to, an input/output circuit (not shown in FIG. 10) of the device, such as input/output circuit 162 of FIG. 1A.

Interface region 1000 further includes a number of conductors (also referred to herein as "conductive paths") 1030 coupling power supply pads 1006/1008 to respective vias 1010. Further, interface region 1000 includes a number of conductors (also referred to herein as "conductive paths") 1040 coupling DQ pads 1004 to respective vias 1010.

As illustrated in FIG. 10, row 1002 of DQ pads 1004 and row 1005 of power supply pads 1006/1008 are offset in at least two dimensions (e.g., X and Y dimensions). Further, according to various embodiments, each DQ pad 1004 may be separated from an adjacent DQ pad 1004 via conductor 1030 coupled between power supply pad 1006/1008 and via 1010. Thus, in these embodiments, each DQ pad 1004 may be shielded from adjacent DQ pads (e.g., to reduce noise between DQ pads).

As a non-limiting example, a pitch of DQ pads 1004 of interface region 1000 is approximately 93.0 micrometers, and a pitch of vias 1010 is approximately 20 micrometers. Further, for example, a longest DQ path length (i.e., from a DQ pad 1004 to a via 1010) of interface region 1000, which is indicated by reference numeral 1012, is approximately 137.4 micrometers, and a shortest DQ path length (i.e., from a DQ pad 1004 to a via 1010), which is indicated by reference numeral 1014, is approximately 75.5 micrometers. Thus, is this example, a maximum path length difference of interface region 1000 is approximately 61.9 micrometers.

Figure 11:
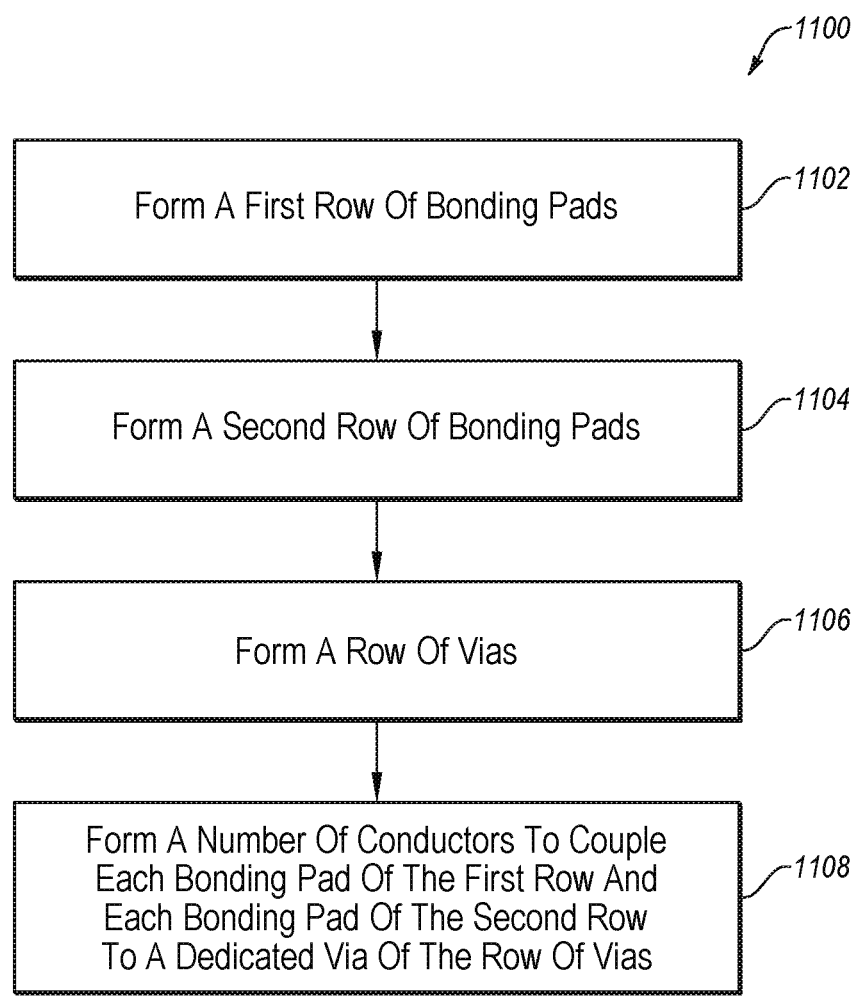
FIG. 11 is a flowchart of an example method of forming an interface region of a device, in accordance with various embodiments of the present disclosure.

FIG. 11 is a flowchart of an example method 1100 of forming an interface region of a device (e.g., a microelectronic device, a semiconductor device, and/or a memory device), in accordance with various embodiments of the disclosure. Method 1100 may be arranged in accordance with at least one embodiment described in the present disclosure. Although illustrated as discrete blocks, various blocks may be divided into additional blocks, combined into fewer blocks, or eliminated, depending on the desired implementation.

Method 1100 may begin at block 1102, wherein a first row of bond pads may be formed, and method 1100 may proceed to block 1104. For example, a number of bond pads including power supply pads (e.g., VSS pads and/or VDDQ pads) may be formed in the first row. As non-limiting examples, a pitch of the bond pads of the first row may be substantially 120 micrometers, substantially 93 micrometers, substantially 89 micrometers, or any other suitable value.

At block 1104, a second row of bond pads may be formed, and method 1100 may proceed to block 1106. For example, a number of input/output (DQ) pads may be formed in the second row. In some embodiments, the second row of bond pads may be offset from the first row of bond pads in at least two dimensions (e.g., X and Y dimensions). As non-limiting examples, a pitch of the bond pads of the second row may be substantially 120 micrometers, substantially 93 micrometers, substantially 89 micrometers, or any other suitable value.

At block 1106, a row of vias may be formed, and method 1100 may proceed to block 1108. For example, the row of vias (e.g., iRDL vias) may be formed such that the second row of bond pads is positioned at least partially between the row of vias and the first row of bond pads. As non-limiting examples, a pitch of the vias may be substantially 60 micrometers, substantially 20 micrometers, or any other suitable value. More specifically, for example, in at least some embodiments, a pitch of the bond pads of the first row and the second row may be substantially 120 micrometers, and a pitch of the vias may be substantially 60 micrometers. In an at least one other embodiment, for example, a pitch of the bond pads of the first row and the second row may be between substantially 89-93 micrometers, and a pitch of the vias may be substantially 20 micrometers.

At block 1108, a number of conductors may be formed to couple each bond pad of the first row and each bond pad of the second row to a dedicated via of the row of vias. For example, each conductor (e.g., iRDL wiring) may be formed to couple a bond pad (i.e., either a power supply pad of the first row or a DQ pad of the second row) to a dedicated via. In some embodiments, at least some conductors that couple a power supply pad of the first row to an associated via may be formed between adjacent DQ pads of the second row (e.g., to act as a shield between adjacent DQ pads). For example, a length of the shortest conductor coupling a bond pad of the second row to a dedicated via may be approximately 10.0 micrometers or less (e.g., approximately zero (0) micrometers). Further, for example, a length of the longest conductor coupling a bond pad of the second row to a dedicated via may be approximately 10.0 micrometers or less (e.g., approximately zero (0) micrometers). Thus, in these embodiments, a maximum path length difference may be approximately ten (10) micrometers or less (e.g., nearly zero (0) micrometers).

In other embodiments, a length of the shortest conductor coupling a bond pad of the second row to a dedicated via may be, for example, approximately 75.5 micrometers. In these embodiments, for example, a length of the longest conductor coupling a bond pad of the second row to a dedicated via may be, for example, approximately 137.4 micrometers. Thus, in these embodiments, a maximum path length difference may be approximately 61.9 micrometers.

Modifications, additions, or omissions may be made to method 1100 without departing from the scope of the present disclosure. For example, the operations of method 1100 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein one or more additional rows of boding pads (e.g., a row of power supply pads and/or a row of DQ pads) may be formed. For example, a third row of power supply pads may be formed and a fourth row of DQ pads may be formed such that the fourth row of DQ pads is positioned at least partially between the row of vias and the third row of power supply pads. Further, another number of conductors may be formed to couple each bond pad of the third row and each bond pad of the fourth row to a dedicated via of the row of vias.

A memory system is also disclosed. According to various embodiments, the memory system may include a controller and a number of memory devices. Each memory device may include one or more memory cell arrays, which may include a number of memory cells.

FIG. 12 is a simplified block diagram of a memory system 1200 implemented according to one or more embodiments described herein. Memory system 1200, which may include, for example, a semiconductor device, includes a number of memory devices 1202 and a controller 1204. For example, at least one memory device 1202 may include one or more interface configurations, as described herein. Controller 1204 may be operatively coupled with memory devices 1202 so as to convey command/address signals (e.g., command/address signals 226 of FIG. 1A) to memory devices 1202.

An electronic system is also disclosed. According to various embodiments, the electronic system may include a memory device including a number of memory dies, each memory die having an array of memory cells. Each memory cell may include an access transistor and a storage element operably coupled with the access transistor.

FIG. 13 is a simplified block diagram of an electronic system 1300 implemented according to one or more embodiments described herein. Electronic system 1300 includes at least one input device 1302, which may include, for example, a keyboard, a mouse, or a touch screen. Electronic system 1300 further includes at least one output device 1304, such as a monitor, a touch screen, or a speaker. Input device 1302 and output device 1304 are not necessarily separable from one another. Electronic system 1300 further includes a storage device 1306. Input device 1302, output device 1304, and storage device 1306 may be coupled to a processor 1308. Electronic system 1300 further includes a memory system 1310 coupled to processor 1308. Memory system 1310 which may include memory system 1200 of FIG. 12. Electronic system 1300 may include, for example, a computing, processing, industrial, or consumer product. For example, without limitation, electronic system 1300 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the present disclosure may include a microelectronic device. The microelectronic device may include a first row of power supply pads, a first row of input/output (DQ) pads, and a row of vias. The first row of DQ pads may be positioned at least partially between the row of vias and the first row of power supply pads. The microelectronic device may further include a number of conductors. Each via of the row of vias may be coupled, via an associated conductor of the number of conductors, to either a power supply pad of the first row of power supply pads or a DQ pad of the first row of DQ pads.

According to another embodiment of the present disclosure, a semiconductor device may include a number of power supply pads, a number of input/output (DQ) pads, and a number of vias. Each via of the number of vias may be coupled, via an associated conductive path, to either a power supply pad of the number of power supply pads or a DQ pad of the number of DQ pads. Further, each conductive path for coupling a DQ pad of the number of DQ pads to an associated via of the number of vias has a length that is less than each conductive path for coupling a power supply pad of the number of power supply pads to an associated via of the number of vias.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device and comprising a first number of bond pads, a second number of bond pads, a number of conductors, and a number of vias. Each via of the number of vias may be coupled, via an associated conductor of the number of conductor, to either a bond pad of the first number of bond pads or a bond pad of the second number of bond pads. Further, each conductor that couples a bond pad of the first number of bond pads to an associated via of the number of vias has a length that is greater than each conductor that couples a bond pad of the second number of bond pads to an associated via of the number of vias.

One or more other embodiments of the present disclosure include methods of forming an interface region of a device. A method may include forming a first row of bond pads and forming a second row of bond pads offset from the first row of bond pads. The method may also include forming a row of vias. Further, the method may include forming a first number of conductors to couple each bond pad of the first row of bond pads to a dedicated via of the row of vias. At least some bond pads of the second row of bond pads are separated from adjacent bond pads of the second row of bond pads via a conductor of the first number of conductors. Also, the method may include forming a second number of conductors to couple each bond pad of the second row of bond pads to a dedicated via of the row of vias.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/of" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
   a first row of power supply pads;
   a first row of input/output (DQ) pads, wherein the first row of power supply pads is offset from the first row of DQ pads in a first dimension and each DQ pad of the first row of DQ pads is at least partially offset from each power supply pad of the first row of power supply pads in a second, different dimension;
   a row of vias, the first row of DQ pads positioned at least partially between the row of vias and the first row of power supply pads; and
   a number of conductors, each via of the row of vias coupled, via a dedicated conductor of the number of conductors, to either a power supply pad of the first row of power supply pads or a DQ pad of the first row of DQ pads, wherein each DQ pad of the first row of DQ pads is at least partially separated from an adjacent DQ pad of the first row of DQ pads by a conductor of the number of conductors, wherein a maximum length of each conductor of the number of conductors coupling a via of the row of vias to a DQ pad of the first row of DQ pads is approximately 10 micrometers.

2. The device of claim 1, further comprising:
   a second row of power supply pads; and
   a second row of DQ pads, the second row of DQ pads positioned at least partially between the row of vias and the second row of power supply pads.

3. The device of claim 2, wherein the first row of power supply pads includes first power supply pads each coupled to a first voltage; and
   wherein the second row of power supply pads includes second power supply pads each coupled to a second voltage different from the first voltage.

4. The device of claim 1, further comprising an input/output circuit including the row of vias.

5. The device of claim 1, wherein a pitch associated with the first row of DQ pads is at least approximately twice a value of a pitch associated with the row of vias.

6. The device of claim 1, wherein the first row of power supply pads includes first power supply pads each supplied with a first voltage and second power supply pads each supplied with a second voltage different from the first voltage.

7. The device of claim 6, wherein the first row of power supply pads extends such that the first and second power supply pads are arranged alternately.

8. A device, comprising:
   a first row of power supply pads;
   a first row of input/output (DQ) pads, wherein the first row of power supply pads is offset from the first row of DQ pads in a first dimension and each DQ pad of the first row of DQ pads is at least partially offset from each power supply pad of the first row of power supply pads in a second, different dimension;
   a row of vias, the first row of DQ pads positioned at least partially between the row of vias and the first row of power supply pads;
   a number of conductors, each via of the row of vias coupled, via a dedicated conductor of the number of conductors, to either a power supply pad of the first row of power supply pads or a DQ pad of the first row of DQ pads, wherein each DQ pad of the first row of DQ pads is at least partially separated from an adjacent DQ pad of the first row of DQ pads by a conductor of the number of conductors;
   a second row of power supply pads;
   a second row of DQ pads, the second row of DQ pads positioned at least partially between the row of vias and the second row of power supply pads; and
   an additional number of conductors, each via of the row of vias coupled, via an associated conductor of the additional number of conductors, to either a power supply pad of the second row of power supply pads or a DQ pad of the second row of DQ pads, wherein a maximum length of each conductor of the additional number of conductors coupling a via of the row of vias to a DQ pad of the second row of DQ pads is approximately 10 micrometers.

9. A device, comprising:
a number of power supply pads;
a number of input/output (DQ) pads, wherein the number of power supply pads comprises a row of power supply pads and the number of DQ pads comprises a row of DQ pads, the row of power supply pads offset from the row of DQ pads in a first direction and each DQ pad of the row of DQ pads at least partially offset from each power supply pad of the row of power supply pads in a second, different dimension; and
a number of vias, each via of the number of vias coupled, via a dedicated conductive path of a number of conductive paths, to either a power supply pad of the number of power supply pads or a DQ pad of the number of DQ pads;
each conductive path for coupling a DQ pad of the number of DQ pads to an associated via of the number of vias having a length that is less than each conductive path for coupling a power supply pad of the number of power supply pads to an associated via of the number of vias, wherein each DQ pad of the number of DQ pads is at least partially separated from an adjacent DQ pad of the number of DQ pads by a conductive path of the number of conductive paths, wherein a maximum length of each conductive path of the number of conductive paths is approximately ten (10) micrometers.

10. The device of claim 9, further comprising an input/output (I/O) circuit either coupled to or including one or more vias of the number of vias.

11. The device of claim 9, wherein a length of each conductive path for coupling the DQ pad to the associated via is approximately ten (10) micrometers.

12. The device of claim 9, wherein each DQ pad of the number of DQ pads is shielded from an adjacent DQ pad of the number of DQ pads via a conductive path.

13. The device of claim 9, wherein a value of a pitch associated with the number of DQ pads is at least approximately twice a value of a pitch associated with the number of vias.

14. The device of claim 13, wherein a value of a pitch associated with the number of power supply pads is substantially equal to the pitch associated with the number of DQ pads.

15. The device of claim 9, wherein a maximum path length difference between two conductive paths coupling DQ pads of the number of DQ pads to associated vias of the number of vias is approximately ten (10) micrometers.

16. A system, comprising:
at least one input device;
at least one output device;
at least one processor device operably coupled to the input device and the output device; and
at least one memory device operably coupled to the at least one processor device and comprising:
a first number of bond pads;
a second number of bond pads, wherein the first number of bond pads comprises a first row of bond pads and the second number of bond pads comprises a second row of bond pads, the first row of bond pads offset from the second row of bond pads in a first direction and each bond pad of the first row of bond pads at least partially offset from each bond pad of the second row of bond pads in a second, different dimension;
a number of conductors; and
a number of vias, each via of the number of vias coupled, via a dedicated conductor of the number of conductors, to either a bond pad of the first number of bond pads or a bond pad of the second number of bond pads;
each conductor coupling a bond pad of the first number of bond pads to an associated via of the number of vias having a length that is greater than each conductor coupling a bond pad of the second number of bond pads to an associated via of the number of vias, wherein each bond pad of the second number of bond pads is separated from an adjacent bond pad of the second number of bond pads via a conductor of the number of conductors, wherein each conductor coupled from a bond pad of the second number of bond pads to an associated via of the number of vias has a maximum length of approximately ten (10) micrometers.

17. The system of claim 16, wherein each bond pad of the first number of bond pads comprises a power supply pad and each bond pad of the second number of bond pads comprises an input/output (DQ) pad.

18. The system of claim 16, wherein each bond pad of the second number of bond pads is separated from an adjacent bond pad of the of the second number of bond pads by a conductor of the number of conductors coupling a bond pad of the first number of bond pads to an associated via of the number of vias.

19. The system of claim 16, wherein a maximum path length difference between shortest and longest conductors coupling bond pads of the second number of bond pads to associated via of the number of vias is approximately ten (10) micrometers.

* * * * *

UNITED STATES PATENT AND TRADEMARK OFFICE
CERTIFICATE OF CORRECTION

| | |
|---|---|
| PATENT NO. | : 12,033,945 B2 |
| APPLICATION NO. | : 16/832550 |
| DATED | : July 9, 2024 |
| INVENTOR(S) | : Hayato Oishi, Satoru Sugimoto and Hiroki Hosaka |

It is certified that error appears in the above-identified patent and that said Letters Patent is hereby corrected as shown below:

In the Specification

Column 5,   Line 14,   change "CK and/CK may" to --CK and /CK may--
Column 15,  Line 25,   change "term "and/of" is" to --term "and/or" is--

Signed and Sealed this
Thirteenth Day of August, 2024

Katherine Kelly Vidal
*Director of the United States Patent and Trademark Office*